United States Patent
Goto

(10) Patent No.: US 6,707,301 B2
(45) Date of Patent: Mar. 16, 2004

(54) EXTERNAL MAGNETIC FIELD MEASURING METHOD, STATIC MAGNETIC FIELD CORRECTING METHOD, EXTERNAL MAGNETIC FIELD MEASURING APPARATUS, AND MRI SYSTEM

(75) Inventor: Takao Goto, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 20 days.

(21) Appl. No.: 10/175,997

(22) Filed: Jun. 20, 2002

(65) Prior Publication Data

US 2002/0195977 A1 Dec. 26, 2002

(30) Foreign Application Priority Data

Jun. 21, 2001 (JP) ........................................ 2001-187532

(51) Int. Cl.[7] ................................................ G01V 3/00
(52) U.S. Cl. ....................... 324/313; 324/319; 324/320; 324/322; 324/331
(58) Field of Search ................................ 324/313, 319, 324/320, 322, 331, 309, 307, 318, 306

(56) References Cited

U.S. PATENT DOCUMENTS

| 5,054,489 A | 10/1991 | Axel et al. ................. 128/653 |
| 5,200,701 A | * 4/1993 | Siebold et al. .............. 324/309 |
| 5,235,279 A | * 8/1993 | Kaufman et al. ........... 324/309 |
| 5,729,139 A | 3/1998 | Goto .......................... 324/309 |
| 5,905,377 A | * 5/1999 | Kerr et al. ................... 324/309 |
| 6,127,825 A | 10/2000 | Goto .......................... 324/307 |
| 6,137,289 A | 10/2000 | Goto .......................... 324/306 |
| 6,218,834 B1 | 4/2001 | Goto .......................... 324/307 |
| 6,307,370 B1 | 10/2001 | Schauwecker et al. ...... 324/318 |
| 6,362,623 B1 | 3/2002 | Goto .......................... 324/318 |
| 6,369,464 B1 | 4/2002 | Schauwecker et al. ........ 307/91 |
| 6,377,048 B1 | 4/2002 | Golan et al. ................. 324/318 |
| 6,392,411 B1 | 5/2002 | Goto .......................... 324/309 |
| 6,489,765 B2 | * 12/2002 | Goto .......................... 324/307 |

* cited by examiner

Primary Examiner—Haissa Philogene
(74) Attorney, Agent, or Firm—Carl B. Horton, Esq.; Armstrong Teasdale LLP

(57) ABSTRACT

In order to nullify the adverse effect of an external magnetic field on a static magnetic field generated in an MRI system, small-size coils are used to generate a compensation magnetic field. Thus, the component of the static magnetic field to be applied to a magnetic sensor is canceled. The magnetic sensor can therefore detect the external magnetic field highly precisely. A correction current proportional to the external magnetic field detected highly precisely is fed to BO correction coils. Eventually, the external magnetic field that adversely affects the static magnetic field is canceled.

11 Claims, 9 Drawing Sheets

EXTERNAL MAGNETIC FIELD MEASURING METHOD, STATIC MAGNETIC FIELD CORRECTING METHOD, EXTERNAL MAGNETIC FIELD MEASURING APPARATUS, AND MRI SYSTEM

CROSS REFERENCE TO RELATED APPLICATIONS

This application claims the benefit of Japanese Application No. 2001-187532 filed Jun. 21, 2001.

BACKGROUND OF THE INVENTION

The present invention relates to an external magnetic field measuring method, a static magnetic field correcting method, an external magnetic field measuring apparatus, and a magnetic resonance imaging (MRI) system. More particularly, the present invention relates to an external magnetic field measuring method for measuring the strength of a magnetic field applied externally to an MRI system. The present invention also relates to a static magnetic field correcting method for correcting a variation in the strength of a static magnetic field caused by a magnetic field applied externally to an MRI system. Moreover, the present invention relates to an external magnetic field measuring apparatus for measuring the strength of a magnetic field applied externally to an MRI system. Furthermore, the present invention relates to an MRI system having the ability to correct a variation in the strength of a static magnetic field caused by a magnetic field applied externally thereto.

In MRI systems, a magnet assembly generates a static magnetic field of a predetermined strength. However, the strength of the static magnetic field is varied with application of an external magnetic field to an MRI system.

In efforts to prevent the variation in the strength of a static magnetic field caused by an external magnetic field, the magnet assembly included in the MRI system may be stored in a shield room or buried under the ground (Japanese Unexamined Patent Publication No. 2000-70245).

However, when only the passive method of storing a magnet assembly of an MRI system in a shield room or burying the magnet assembly under the ground is adopted, a variation in the strength of a static magnetic field caused by an external magnetic field cannot be prevented satisfactorily.

SUMMARY OF THE INVENTION

The first object of the present invention is to provide an external magnetic field measuring method and apparatus for measuring the strength of a magnetic field applied externally to an MRI system.

The second object of the present invention is to provide a static magnetic field correcting method for correcting a variation in the strength of a static magnetic field caused by a magnetic field externally applied to an MRI system, and to provide an MRI system having the ability to correct the variation in the strength of a static magnetic field caused by a magnetic field applied externally thereto.

From the first aspect of the present invention, there is provided an external magnetic field measuring method according to which a magnetization detecting means is placed near a magnet assembly included in an MRI system. A magnetic field generating means is located near the magnetization detecting means. The magnetic field generating means generates a compensation magnetic field so that the compensation magnetic field will cancel a magnetic field generated by the magnet assembly and detected by the magnetization detecting means in the absence of an external magnetic field. The magnetization detecting means measures the external magnetic field with the compensation magnetic field generated.

In order to highly precisely measure an external magnetic field that adversely affects a static magnetic field generated in an MRI system, a magnetization detecting means whose dynamic range permits high-precision detection of an external magnetic field is preferably located near a magnet assembly. This is however unfeasible because near the magnet assembly, a static magnetic field generated by the magnet assembly is much stronger than the external magnetic field. Therefore, if the magnetization detecting means whose dynamic range permits high-precision detection of an external magnetic field is adopted, the strength of the static magnetic field generated by the magnet assembly exceeds the dynamic range. This results in a failure to measure the external magnetic field. In reality, therefore, the dynamic range of the magnetization detecting means is expanded or the magnetization detecting means is located apart from the magnet assembly. If the former countermeasure is adopted, the external magnetic field cannot be detected high precisely. In contrast, if the latter is adopted, it is uncertain whether an external magnetic field being measured is an external magnetic field that adversely affects a static magnetic field generated in the MRI system.

In contrast, according to the external magnetic field measuring method provided from the first aspect, the magnetic field generating means generates a compensation magnetic field so that the compensation magnetic field will cancel a magnetic field generated by the magnet assembly. The magnetization detecting means whose dynamic range permits high-precision detection of an external magnetic field can therefore be located near the magnet assembly. Consequently, an external magnetic field that adversely affects a static magnetic field generated in an MRI system can be measured highly precisely.

From the second aspect of the present invention, there is provided an external magnetic field measuring method based on the aforesaid external magnetic field measuring method. Herein, when the magnetization detecting means includes a Z-direction magnetic sensor. Assuming that the direction of a static magnetic field generated by the magnet assembly is regarded as a Z direction, the Z-direction magnetic sensor detects a magnetization exhibited in the Z direction.

According to the external magnetic field measuring method provided from the second aspect of the present invention, the Z-direction magnetic sensor is included. Therefore, the major component of an external magnetic field that is directed in the same direction as the static magnetic field and that adversely affects the static magnetic field generated in an MRI system can be measured preferably.

From the third aspect of the present invention, there is provided an external magnetic field measuring method based on the aforesaid external magnetic field measuring methods. Herein, the magnetization detecting means includes a Z-direction magnetic sensor, a Y-direction magnetic sensor, and an X-direction magnetic sensor. Assuming that the direction of a static magnetic field generated by the magnet assembly is regarded as a Z direction and that two mutually orthogonal directions orthogonal to the Z direction are regarded as Y and X directions respectively, the Z-direction magnetic sensor, Y-direction magnetic sensor, and X-direction magnetic sensor detect magnetizations exhibited due to the magnet in the Z, Y, and X directions respectively.

According to the external magnetic field measuring method provided from the third aspect of the present invention, the Z-direction magnetic sensor is included. Therefore, the major component of an external magnetic field that adversely affects the static magnetic field generated in an MRI system and that is directed in the same direction as the static magnetic field can be measured preferably. Moreover, since the Y-direction magnetic sensor and X-direction magnetic sensor are also included, the components of the external magnetic field other than the major component that adversely affect the static magnetic field generated in the MRI system can be measured preferably.

From the fourth aspect of the present invention, there is provided an external magnetic field measuring method based on the aforesaid external magnetic field measuring methods. Herein, the magnetic field generating means includes at least a pair of small-size coils and a coil drive circuit. The pair of small-size coils is arranged to sandwich the Z-direction magnetic sensor in the Z direction. The coil drive circuit feeds a current to the pair of small-size coils.

According to the external magnetic field measuring method provided from the fourth aspect of the present invention, a current flows into the pair of small-size coils that is opposed to each other in the Z direction. Consequently, a compensation magnetic field can be preferably generated for canceling a static magnetic field that is generated in an MRI system and applied to the Z-direction magnetic sensor.

From the fifth aspect of the present invention, there is provided an external magnetic field measuring method based on the aforesaid external magnetic field measuring methods. Herein, the magnetic field generating means includes three pairs of small-size coils and a coil drive circuit. One of the three pairs of small-size coils is arranged to sandwich the Z-direction magnetic sensor in the Z direction. Other pair of small-size coils is arranged to sandwich the Y-direction magnetic sensor in the Y direction. The other pair of small-size coils is arranged to sandwich the X-direction magnetic sensor in the X direction. The coil drive circuit feeds a current to the small-size coils.

According to the external magnetic field measuring method provided from the fifth aspect of the present invention, a current flows into the pair of small-size coils that is opposed to each other in the Z direction. Consequently, a compensation magnetic field is preferably generated for canceling the major component, that is, the Z-direction component of a static magnetic field that is generated in an MRI system and that is applied to the Z-direction magnetic sensor. Moreover, a current flows into the pair of small-size coils that is opposed to each other in the Y direction. Consequently, a compensation magnetic field is preferably generated for canceling the Y-direction component of the static magnetic field that is generated in the MRI system and that is applied to the Y-direction magnetic sensor. Moreover, a current flows into the pair of small-size coils that is opposed to each other in the X direction. Consequently, a compensation magnetic field is preferably generated for canceling the X-direction component of the static magnetic field that is generated in the MRI system and that is applied to the X-direction magnetic sensor.

From the sixth aspect of the present invention, there is provided an external magnetic field measuring method based on the aforesaid external magnetic field measuring methods. Herein, the magnetization detecting means is placed above the magnet assembly.

Among the spaces present near the magnet assembly included in an MRI system, the spaces present back and forth and right and left are occupied with a table, a control unit, an operation unit, and others. Placement of the magnetization detecting means in the space present below the magnet assembly makes it hard to maintain the magnetization detecting means.

According to the external magnetic field measuring method provided from the sixth aspect of the present invention, the magnetization detecting means is placed in the space present above the magnet assembly. Therefore, the magnetization detecting means will not interfere with placement of the table, control unit, and operation unit, but can be maintained easily.

From the seventh aspect of the present invention, there is provided an external magnetic field measuring method based on the aforesaid external magnetic field measuring methods. Herein, the compensation magnetic field is corrected based on temperature.

In particular, when the magnet assembly includes a permanent magnet, the strength of a static magnetic field is liable to vary with a change in temperature.

According to the external magnetic field measuring method provided from the sixth aspect of the present invention, the compensation magnetic field is corrected based on temperature. Therefore, despite a change in temperature, a magnetic field generated by the magnet assembly can be canceled preferably.

From the eighth aspect of the present invention, there is provided a static magnetic field correcting method. Herein, a magnetic field correction coil is added to a yoke included in a magnet assembly of an MRI system. A correction current that is proportional to an external magnetic field measured according to the external magnetic field measuring method provided from any of the first to seventh aspects of the present invention is fed to the magnetic field correction coil. A correction magnetic field is thus generated in order to correct a static magnetic field.

According to the static magnetic field correcting method provided from the eighth aspect of the present invention, a correction current that is proportional to an external magnetic field detected highly precisely is fed to the correction coil. A correction magnetic field is thus applied to the yoke included in the magnet assembly, whereby the adverse effect of the external magnetic field on the static magnetic field can be nullified highly precisely.

From the ninth aspect of the present invention, there is provided a static magnetic field correcting method. Herein, assuming that the direction of a static magnetic field generated by a magnet assembly included in an MRI system is regarded as a Z direction, a pair of large-size coils is arranged to sandwich the magnet assembly in the Z direction. A correction current that is proportional to an external magnetic field measured according to the external magnetic field measuring method provided from any of the first to seventh aspects of the present invention is fed to the large-size coils. Correction magnetic fields are thus generated in order to correct the static magnetic field.

According to the static magnetic field correcting method provided from the ninth aspect of the present invention, a correction current that is proportional to an external magnetic field detected highly precisely is fed to the large-size coils that are opposed to each other in the Z direction. Correction magnetic fields that are directed in the Z direction are thus applied, whereby the Z-direction component, that is, the major component of the external magnetic field that adversely affects the static magnetic field can be canceled highly precisely.

From the tenth aspect of the present invention, there is provided a static magnetic field correcting method. Herein, assuming that the direction of a static magnetic field generated by a magnet assembly included in an MRI system is regarded as a Z direction and that two mutually orthogonal directions orthogonal to the Z direction are regarded as Y and X directions respectively, a pair of large-size coils is arranged to sandwich the magnet assembly in the Z direction. Another pair of large-size coils is arranged to sandwich the magnet assembly in the Y direction, and another pair of large-size coils is arranged to sandwich the magnet assembly in the X direction. A correction current that is proportional to an external magnetic field measured according to any of the aforesaid external magnetic field measuring methods is fed to the large-size coils. Thus, correction magnetic fields are generated in order to correct the static magnetic field.

According to the static magnetic field correcting method provided from the tenth aspect of the present invention, a correction current that is proportional to an external magnetic field detected highly precisely is fed to the large-size coils that are opposed to each other in the Z direction. Correction magnetic fields that are directed in the Z direction are thus applied. Consequently, the Z-direction component, that is, the major component of the external magnetic field that affects the static magnetic field can be canceled highly precisely. Moreover, the correction current proportional to the external magnetic field detected highly precisely is fed to the large-size coils, which are opposed to each other in the Y direction, in order to apply correction magnetic fields that are directed in the Y direction. Consequently, the Y-direction component of the external magnetic field that affects the static magnetic field can be canceled highly precisely. Moreover, the correction current proportional to the external magnetic field detected highly precisely is fed to the large-size coils, which are opposed to each other in the X direction, in order to apply correction magnetic fields that are directed in the X direction. Consequently, the X-direction component of the external magnetic field that affects the static magnetic field can be canceled highly precisely.

From the eleventh aspect of the present invention, there is provided an external magnetic field measuring apparatus. The external magnetic field measuring apparatus includes a magnetization detecting means and a magnetic field generating means. The magnetization detecting means is placed near a magnet assembly included in an MRI system. The magnetic field generating means is located near the magnetization detecting means. The magnetic field generating means generates a compensation magnetic field so that the compensation magnetic field will cancel a magnetic field that is generated by the magnet assembly and detected by the magnetization detecting means in the absence of an external magnetic field.

In the external magnetic field measuring apparatus provided from the eleventh aspect of the present invention, the external magnetic field measuring method provided from the first aspect of the present invention can be implemented preferably.

From the twelfth aspect of the present invention, there is provided an external magnetic field measuring apparatus based on the aforesaid external magnetic field measuring apparatus. Herein, the magnetization detecting means includes a Z-direction magnetic sensor. Assuming that the direction of a static magnetic field generated by the magnet assembly is regarded as a Z direction, the Z-direction magnetic sensor detects a magnetization exhibited in the Z direction.

In the external magnetic field measuring apparatus provided from the twelfth aspect of the present invention, the external magnetic field measuring method provided from the second aspect thereof can be implemented preferably.

From the thirteenth aspect of the present invention, there is provided an external magnetic field measuring apparatus based on the aforesaid external magnetic field measuring apparatuses. Herein, the magnetization detecting means includes a Z-direction magnetic sensor, a Y-direction magnetic sensor, and an X-direction magnetic sensor respectively. Assuming that the direction of a static magnetic field generated by the magnet assembly is regarded as a Z direction and that two mutually orthogonal directions orthogonal to the Z direction are regarded as Y and X directions respectively, the Z-direction magnetic sensor, Y-direction magnetic sensor, and X-direction magnetic sensor detect magnetizations exhibited due to the magnet assembly in the Z, Y, and X directions respectively.

In the external magnetic field measuring apparatus provided from the thirteenth aspect of the present invention, the external magnetic field measuring method provided from the third aspect thereof can be implemented preferably.

From the fourteenth aspect of the present invention, there is provided an external magnetic field measuring apparatus based on the aforesaid external magnetic field measuring apparatuses. Herein, the magnetic field generating means includes at least a pair of small-size coils and a coil drive circuit. The pair of small-size coils is arranged to sandwich the Z-direction magnetic sensor in the Z direction. The coil drive circuit feeds a current to the small-size coils.

In the external magnetic field measuring apparatus provided from the fourteenth aspect of the present invention, the external magnetic field measuring method provided from the fourth aspect thereof can be implemented preferably.

From the fifteenth aspect of the present invention, there is provided an external magnetic field measuring apparatus based on the aforesaid external magnetic field measuring apparatuses. Herein, the magnetic field generating means includes three pairs of small-size coils and a coil drive circuit. One of the three pairs of small-size coils is arranged to sandwich the Z-direction magnetic sensor in the Z direction. Other pair of small-size coils is arranged to sandwich the Y-direction magnetic sensor in the Y direction. The other pair of small-size coils is arranged to sandwich the X-direction magnetic sensor. The coil drive circuit feeds a current to the small-size coils.

In the external magnetic field measuring apparatus provided from the fifteenth aspect of the present invention, the external magnetic field measuring method provided from the fifth aspect thereof can be implemented preferably.

From the sixteenth aspect of the present invention, there is provided an external magnetic field measuring apparatus based on the aforesaid external magnetic field measuring apparatuses. Herein, the magnetization detecting means is placed above the magnet assembly.

In the external magnetic field measuring apparatus provided from the sixteenth aspect of the present invention, the external magnetic field measuring method provided from the sixth aspect thereof can be implemented preferably.

From the seventeenth aspect of the present invention, there is provided an external magnetic field measuring apparatus based on the aforesaid external magnetic field measuring apparatuses. Herein, the external magnetic field measuring apparatus includes a temperature correcting means for correcting the compensation magnetic field according to temperature.

In the external magnetic field measuring apparatus provided from the seventeenth aspect of the present invention, the external magnetic field measuring method provided from the seventh aspect thereof can be implemented preferably.

From the eighteenth aspect of the present invention, there is provided an MRI system including a magnet assembly, a magnetic field correction coil, and a magnetic field correction coil power supply. The magnet assembly includes a yoke. The magnetic field correction coil is added to the yoke and generates a correction magnetic field. The magnetic field correction coil power supply feeds a correction current, which is proportional to an external magnetic field measured by the external magnetic field measuring apparatus provided from any of the eleventh to seventeenth aspects of the present invention, to the magnetic field correction coil. Consequently, a correction magnetic field is generated in order to correct a static magnetic field.

In the MRI system provided from the eighteenth aspect of the present invention, the static magnetic field correcting method provided from the eighth aspect thereof can be implemented preferably.

From the nineteenth aspect of the present invention, there is provided an MRI system including a pair of large-size coils and a correction current feeding power supply. Assuming that the direction of a static magnetic field generated by a magnet assembly included in an MRI system is regarded as a Z direction, the pair of large-size coils is arranged to sandwich the magnet assembly in the Z direction. The correction current feeding power supply feeds a correction current, which is proportional to an external magnetic field measured by any of the aforesaid external magnetic field measuring apparatuses, to the large-size coils. Correction magnetic fields are thus generated in order to correct the static magnetic field.

In the MRI system provided from the nineteenth aspect of the present invention, the static magnetic field correcting method provided from the ninth aspect thereof can be implemented preferably.

From the twentieth aspect of the present invention, there is provided an MRI system including three pairs of large-size coils and a correction current power supply. Assuming that the direction of a static magnetic field generated by a magnet assembly included in the MRI system is regarded as a Z direction and that two orthogonal directions orthogonal to the Z direction are regarded as Y and X directions respectively, one of the three pairs of large-size coils is arranged to sandwich the magnet assembly in the Z direction. Other pair of large-size coils is arranged to sandwich the magnet assembly in the Y direction. The other pair of large-size coils is arranged to sandwich the magnet assembly in the X direction. The correction current power supply feeds a correction current, which is proportional to an external magnetic field measured by any of the aforesaid external magnetic field measuring apparatuses, to the large-size coils. Correction magnetic fields are thus generated in order to correct the static magnetic field.

In the MRI system provided from the twentieth aspect of the present invention, the static magnetic field correcting method provided from the tenth aspect thereof can be implemented preferably.

According to an external magnetic field measuring method and an external magnetic field measuring apparatus in which the present invention is implemented, a magnetization detecting means whose dynamic range permits high-precision detection of an external magnetic field can be placed near a magnet assembly. Consequently, an external magnetic field that adversely affects a static magnetic field generated in an MRI system can be measured highly precisely.

Moreover, according to a static magnetic field correcting method and an MRI system in which the present invention is implemented, the adverse effect of an external magnetic field on the static magnetic field can be canceled because the external magnetic field can be detected highly precisely.

Further objects and advantages of the present invention will be apparent from the following description of the preferred embodiments of the invention as illustrated in the accompanying drawings.

DETAILED DESCRIPTION OF THE INVENTION

Embodiments of the present invention will be described with reference to drawings below.

First Embodiment

Figure 1:
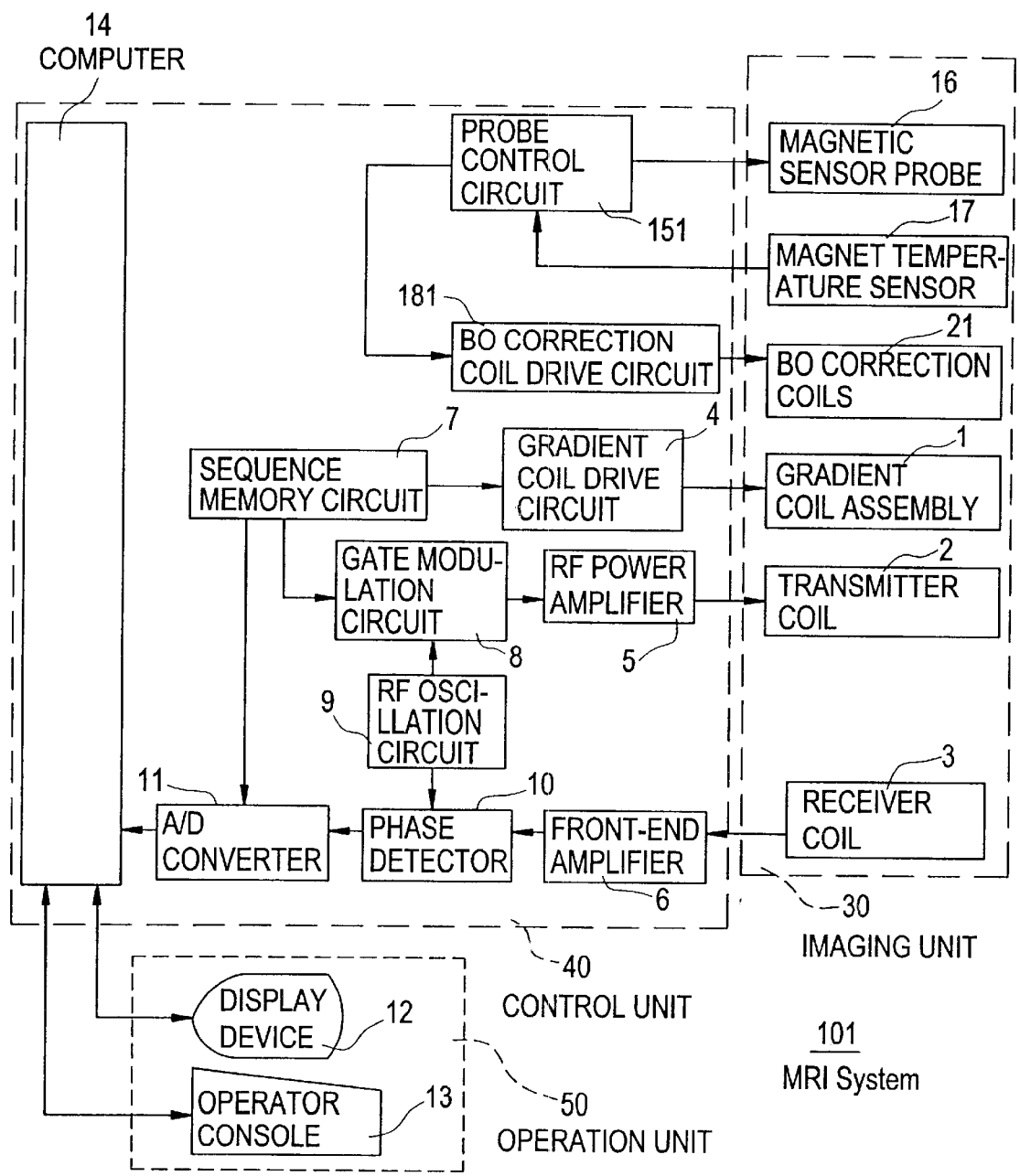
FIG. 1 is a block diagram of an MRI system in accordance with the first embodiment of the present invention.

FIG. 1 is a block diagram showing the configuration of an MRI system 101 in accordance with a first embodiment of the present invention.

The MRI system 101 includes an imaging unit 30, a control unit 40, and an operation unit 50.

The imaging unit 30 includes a gradient coil assembly 1, a transmitter coil 2, a receiver coil 3, a magnetic sensor probe 16, a magnet temperature sensor 17, and B0 correction coils 21.

The control unit 40 includes a computer 14 responsible for MRI imaging, a sequence memory circuit 7, a gradient coil drive circuit 4, a gate modulation circuit 8, an RF oscillation circuit 9, an RF power amplifier 5, a front-end amplifier 6, a phase detector 10, and an A/D converter 11.

Moreover, the control unit 40 includes a probe control circuit 151 for correcting a static magnetic field and a BO correction coil drive circuit 181.

The operation unit 50 includes a display device 12 and an operator console 13.

Figure 2:
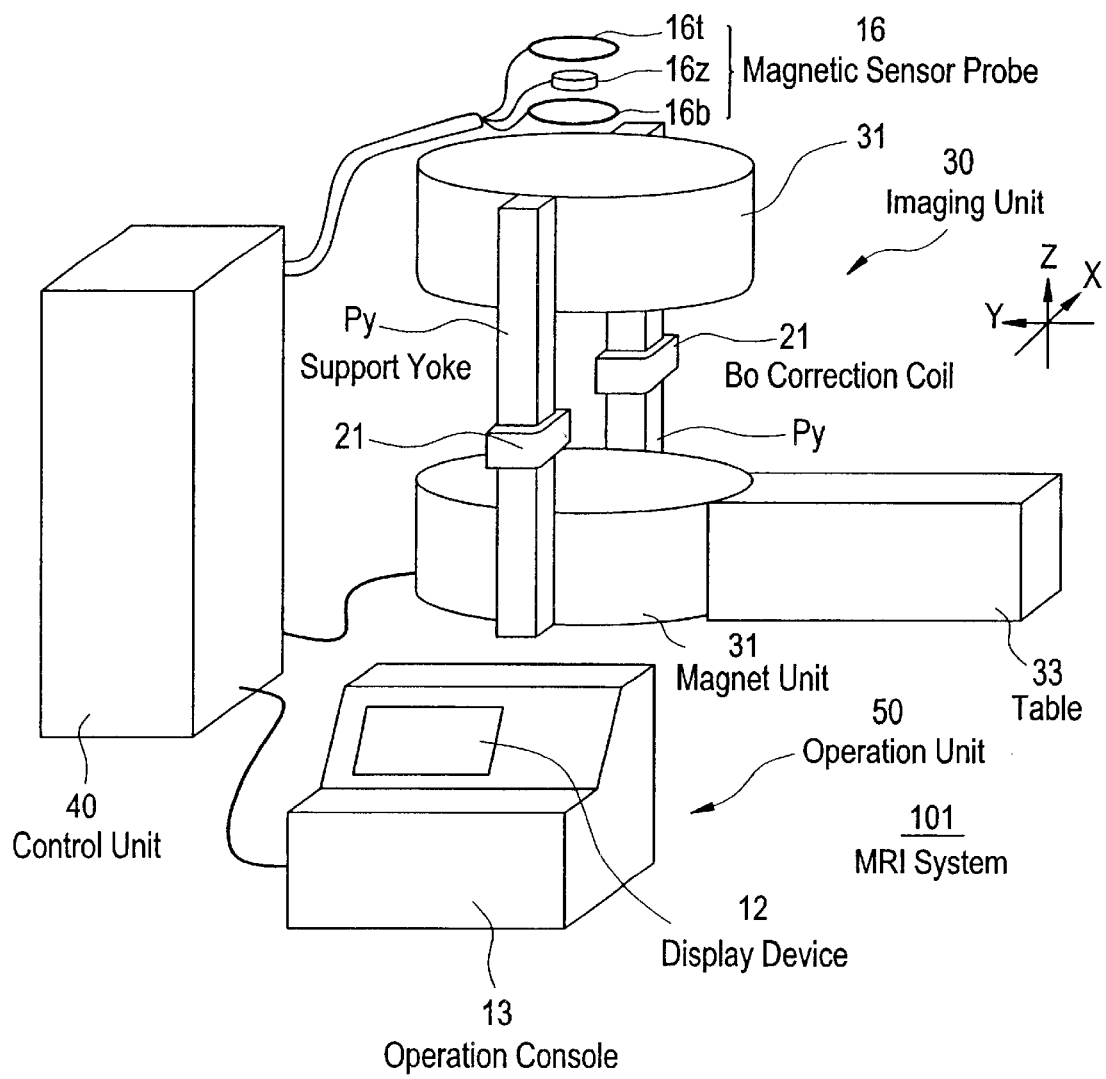
FIG. 2 is a perspective view showing the major portion of the MRI system in accordance with the first embodiment.

FIG. 2 is a perspective view illustratively showing the MRI system 101.

The imaging unit 30 includes magnet units 31, support yokes Py, BO correction coils 21, and a table 33. The magnet units 31 are opposed to each other up and down, thus creating an imaging space between them. The support yokes Py magnetically link the magnet units 31, whereby a magnetic circuit is realized. The BO correction coils 21 are constructed by turning a wire about the middle parts of the support yokes Py by 101 to 200 turns.

The receiver coil 3 is placed in the imaging space created between the magnet units 31, though it is not shown in FIG. 2.

The magnetic sensor probe 16 is placed in the space above the imaging unit 30.

The magnetic sensor probe 16 includes a magnetic sensor 16z and a pair of small-size coils 16t and 16b. The magnetic sensor 16z detects a magnetization exhibited in the Z-direction. The pair of small-size coils 16t and 16b is arranged to sandwich the magnetic sensor 16z in the Z direction.

Figure 3:
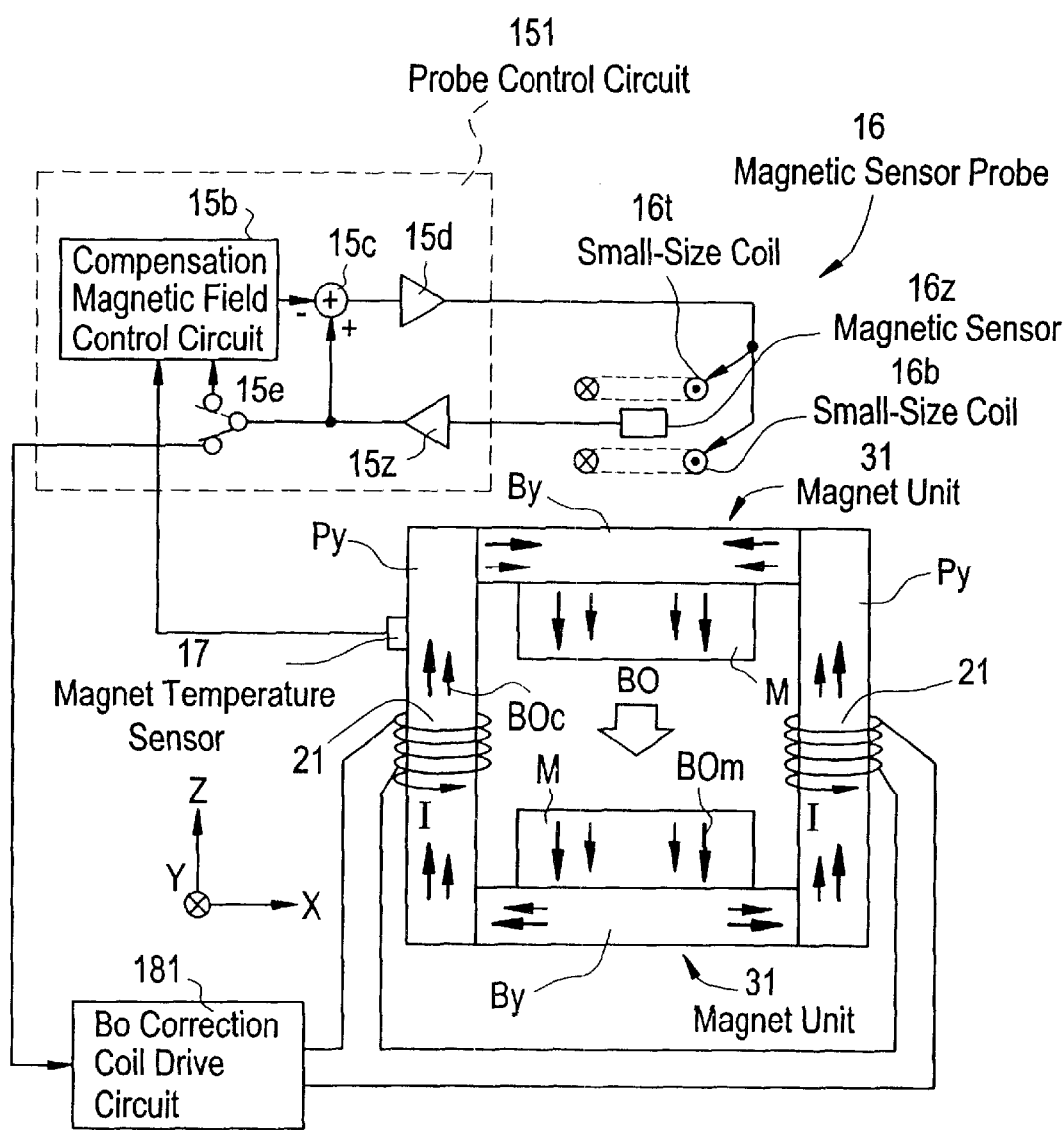
FIG. 3 is an explanatory diagram implying actions to be performed in the MRI system in accordance with the first embodiment.

FIG. 3 is an explanatory diagram concerning actions involved in correction of a static magnetic field.

A permanent magnet M for generating a static magnetic field BOm in the Z direction and a base yoke By are incorporated in each of the upper and lower magnet units 31. The upper and lower base yokes By are magnetically coupled to each other by means of the right and left support yokes Py. In other words, the permanent magnets M, base yokes By, and support yokes Py constitute a magnetic circuit. Incidentally, a super conducting magnet may be substituted for the permanent magnet M.

The BO correction coils 21 added to the right and left support yokes Py are connected in series with each other. A correction current I is fed from the BO correction coil drive circuit 181 to the BO correction coils 21. With the correction current I fed, the right and left BO correction coils 21 generate correction magnetic fields BOc that have the same direction and equal strength. The correction magnetic fields BOc are added to the static magnetic fields BOm generated by the permanent magnets M, whereby a synthetic static magnetic field BO is present in the imaging space.

The BO correction coil drive circuit 181 feeds the correction current I in response to a magnetization detection signal sent from the probe control circuit 151.

The probe control circuit 151 includes an amplifier 15z, a switch 15e, a compensation magnetic field control circuit 15b, an adder 15c, and a compensator 15d. The amplifier 15z produces a magnetization detection signal whose level is proportional to the strength of a magnetic field detected by the magnetic sensor 16z. The switch 15e switches the destinations of the magnetization detection signal between the BO correction coil drive circuit 181 and compensation magnetic field control circuit 15b. The compensation magnetic field control circuit 15b produces a compensation magnetic field signal that has been corrected based on the temperature detected by the magnet temperature sensor 17. The adder 15c produces a difference signal that is a difference of the compensation magnetic field signal from the magnetization detection signal. The compensator 15d feeds a compensation current, which is proportional to the difference signal, to the small-size coils 16t and 16b.

First, an operator switches the contacts of the switch 15e so that the magnetization detection signal will be transferred to the compensation magnetic field control circuit 15b (state indicated with a dashed line). This causes the compensation magnetic field control circuit 15b to autonomously regulate the compensation magnetic field signal so as to set the magnetization detection signal to a zero level. Moreover, the BO correction coil drive circuit 181 sets the correction current I to a zero level.

Thereafter, in the absence of an external magnetic field, the contacts of the switch 15e are switched so that the magnetization detection signal will be transferred to the BO correction coil drive circuit 181 (state indicated with a solid line) This causes the compensation magnetic field control circuit 15b to keep producing the compensation magnetic field signal that brings the magnetization detection signal to a zero level in the absence of an external magnetic field. Moreover, the BO correction coil drive circuit 181 feeds the correction current I, which is proportional to the magnetization detection signal, to the BO correction coils 21.

Thereafter, since the component of the static magnetic field BO to be applied to the magnetic sensor 16z is canceled by a compensation magnetic field generated by the small-size coils 16z and 16b. The magnetic sensor 16z produces a magnetization detection signal that is proportional to an external magnetic field alone. Therefore, in the absence of the external magnetic field, the magnetization detection signal and correction current I assume a zero level. With application of the external magnetic field, the magnetization detection signal proportional to the external magnetic field alone is produced. The correction current I flows to induce a correction magnetic field BOc. Consequently, the external magnetic field that adversely affects the static magnetic field BO is canceled. Eventually, the static magnetic field BO will remain unaffected by the external magnetic field.

The correction magnetic field BOc is much smaller than the static magnetic field BO. The adverse effect of the correction magnetic field BOc on the magnetic sensor 16z can be ignored.

Note that FIG. 3 shows mere examples of the directions of magnetic fields and of currents. The actual directions of magnetic fields and of currents do not always agree with the examples.

According to the first embodiment, the MRI system 101 has the advantages-described below.

(1) The small-size coils 16t and 16b are used to generate a compensation magnetic field that cancels the component of the static magnetic field BO to be applied to the magnetic sensor 16z. Therefore, the magnetic sensor 16z whose dynamic range permits high-precision detection of an external magnetic field can be placed near the magnet units 31. Eventually, the external magnetic field that adversely affects the static magnetic field BO can be measured highly precisely.

(2) A compensation magnetic field signal is corrected based on temperature. Therefore, even if the temperature of the magnet units 31 change, the component of the static magnetic field BO to be applied to the magnetic sensor 16z can be canceled successfully.

(3) The magnetic sensor probe 16 is placed in a space above the magnet units 31. The magnetic sensor probe 16 will therefore not interfere with placement of the table 33, control unit 40, and operation unit 50. Moreover, the magnetic sensor probe 16 can be maintained easily.

(4) The correction current I proportional to an external magnetic field detected highly precisely is fed to the BO correction coils 21 in order to cancel the external magnetic field that adversely affects the static magnetic field BO. The adverse effect of the external magnetic field on the static magnetic field BO can be nullified highly precisely.

Second Embodiment

Figure 4:
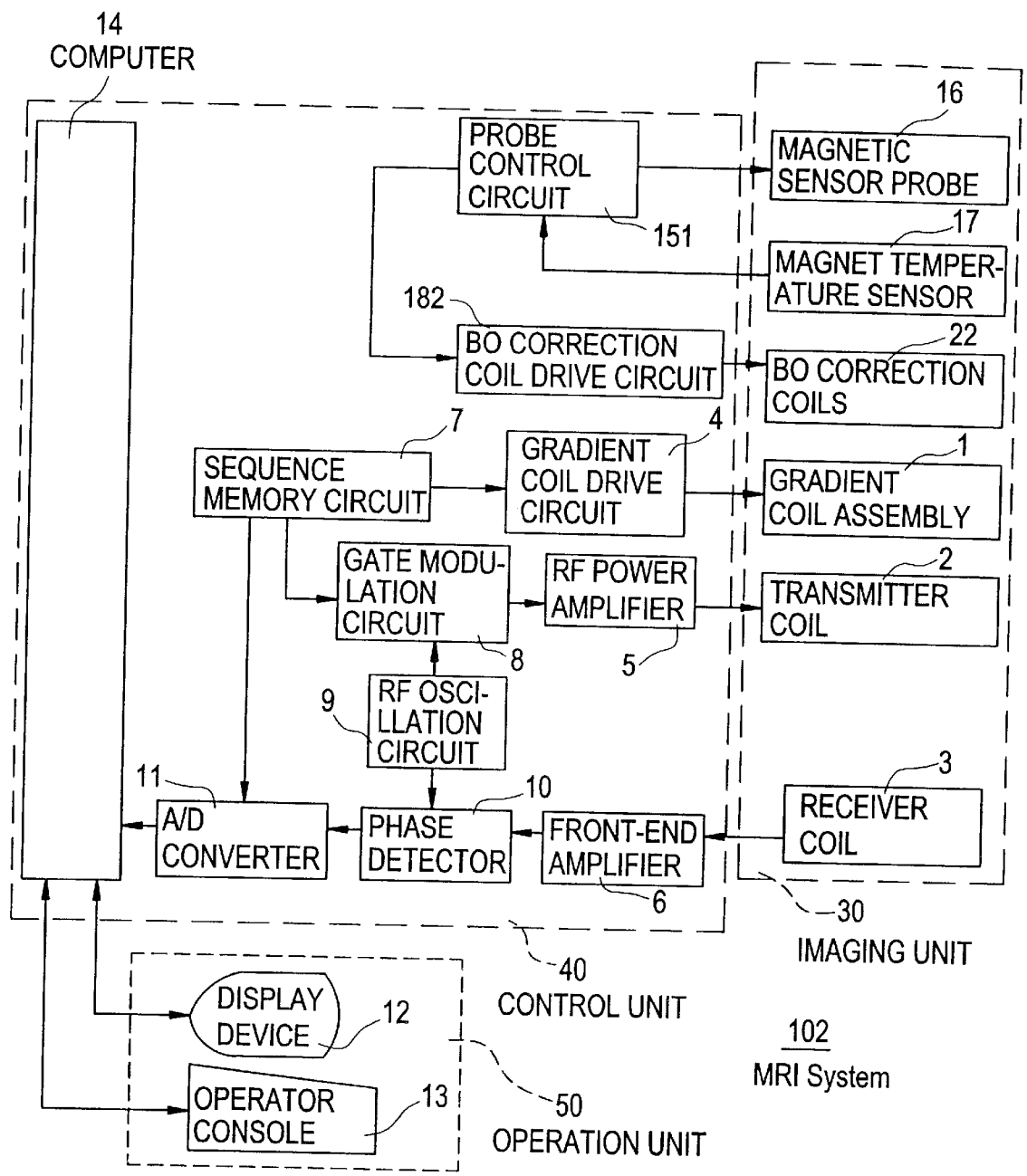
FIG. 4 is a block diagram showing the configuration of an MRI system in accordance with the second embodiment of the present invention.

FIG. 4 is a block diagram showing the configuration of an MRI system 102 in accordance with a second embodiment of the present invention.

The MRI system 101 includes an imaging unit 30, a control unit 40, and an operation unit 50.

The imaging unit 30 includes a gradient coil assembly 1, a transmitter coil 2, a receiver coil 3, a magnetic sensor probe 16, a magnet temperature sensor 17, and BO correction coils 22.

The control unit 40 includes a computer 14 responsible for MRI imaging, a sequence memory circuit 7, a gradient coil drive circuit 4, a gate modulation circuit 8, an RF oscillation circuit 9, an RF power amplifier 5, a front-end amplifier 6, a phase detector 10, and an A/D converter 11.

The control unit 40 includes a probe control circuit 151 for correcting a static magnetic field and a BO correction coil drive circuit 182.

The operation unit 50 includes a display device 12 and an operator console 13.

Figure 5:
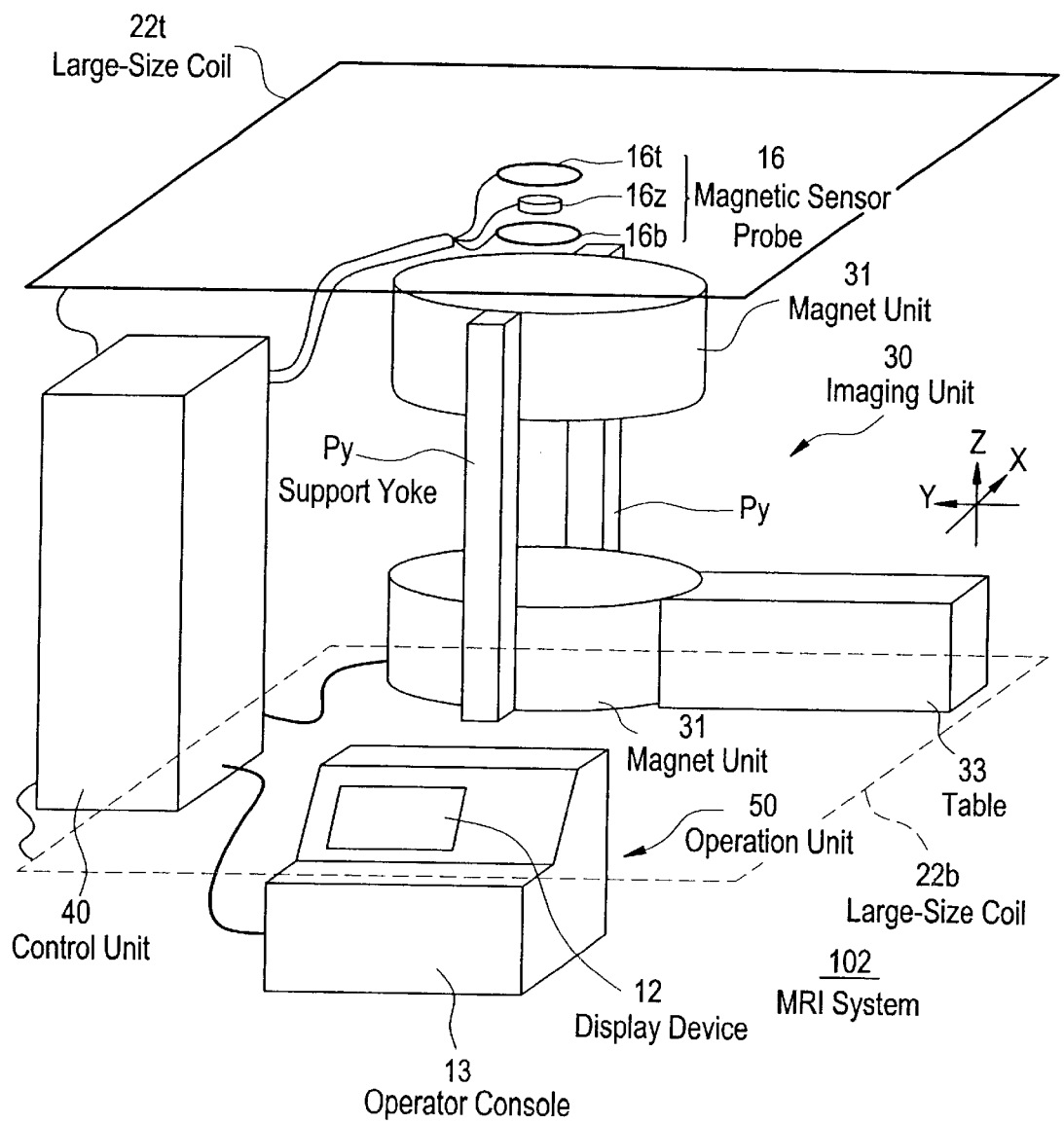
FIG. 5 is a perspective view showing the major portion of the MRI system in accordance with the second embodiment.

FIG. 5 is a perspective view illustratively showing the MRI system 102.

The imaging unit 30 includes magnet units 31, support yokes Py, and a table 33. The magnet units 31 are opposed to each other up and down and create an imaging space between them. The support yokes Py magnetically link the magnet units 31, whereby a magnetic circuit is realized.

The receiver coil 3 is placed in the imaging space created between the magnet units 31, though it is not shown.

The magnetic sensor probe 16 is placed in a space above the imaging unit 30.

The magnetic sensor probe 16 includes a magnetic sensor 16z that detects a magnetization exhibited in the Z direction and a pair of small-size coils 16t and 16b that is arranged to sandwich the magnetic sensor 16z in the Z direction.

Large-size coils 22t and 22b used to cancel an external magnetic field are placed on the ceiling and floor of a room in which the MRI system 102 is installed.

Figure 6:
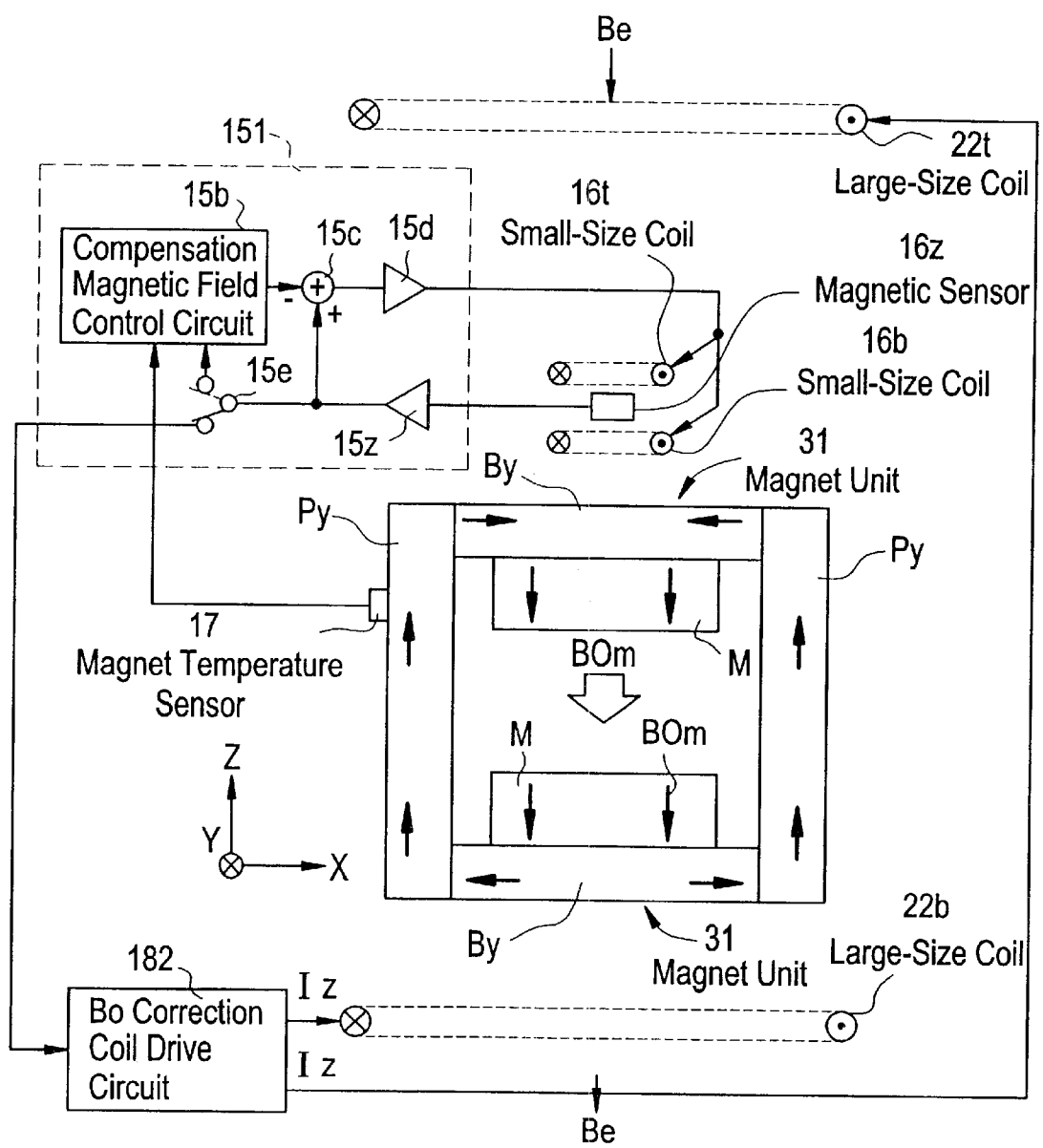
FIG. 6 is an explanatory diagram implying actions to be performed in the MRI system in accordance with the second embodiment.

FIG. 6 is an explanatory diagram concerning actions involved in correction of a static magnetic field.

A permanent magnet M that generates a static magnetic field BOm in the Z direction and a base yoke By are incorporated in each of the upper and lower magnet units 31. The upper and lower base yokes By are magnetically coupled to each other by the right and left support yokes Py. The permanent magnets M, base yokes By, and support yokes Py constitute a magnetic circuit. Incidentally, a super conducting magnet may be substituted for the permanent magnet M.

The probe control circuit 151 includes an amplifier 15z, a switch 15e, a compensation magnetic field control circuit 15b, an adder 15c, and a compensator 15d. The amplifier 15z produces a magnetization detection signal whose level is proportional to the strength of a magnetic field detected by the magnetic sensor 16z. The switch 15e switches the destinations of the magnetization detection signal between the BO correction coil drive circuit 181 and compensation magnetic field control circuit 15b. The compensation magnetic field control circuit 15b produces a compensation magnetic field signal that has been corrected based on the temperature detected by the magnet temperature sensor 17. The adder 15c produces a difference signal that is a difference of the compensation magnetic field signal from the magnetization detection signal. The compensator 15d feeds a compensation current, which is proportional to the difference signal, to the small-size coils 16t and 16b.

A correction current Iz is fed from the BO correction coil drive circuit 182 to the upper and lower large-size coils 22t and 22b. The upper and lower large-size coils 22t and 22b generate correction magnetic fields Be in response to the correction current Iz. The correction magnetic fields Be cancel an external magnetic field.

The BO correction coil drive circuit 182 feeds a correction current I in response to the magnetization detection signal sent from the probe control circuit 151.

First, an operator switches the contacts of the switch 15e so that a magnetization detection signal will be transferred to the compensation magnetic field control circuit 15b (state indicated with a dashed line). This causes the compensation magnetic field control circuit 15b to autonomously regulate a compensation magnetic field signal so as to set the magnetization detection signal to a zero level. Moreover, the BO correction coil drive circuit 182 sets the correction current Iz to a zero level.

Thereafter, in the absence of an external magnetic field, the operator switches the contacts of the switch 15e so that the magnetization detection signal will be transferred to the BO correction coil drive circuit 182 (state indicated with a solid line). This causes the compensation magnetic field control circuit 15b to keep producing the compensation magnetic field signal that brings the magnetization detection signal to a zero level in the absence of the external magnetic field. Moreover, the BO correction coil drive circuit 182 feeds the correction current Iz, which is proportional to the magnetization detection signal, to the large-size coils 22t and 22b.

Thereafter, the component of the static magnetic field BOm to be applied to the magnetic sensor 16z is canceled by the compensation magnetic field generated by the small-size coils 16z and 16b. The magnetic sensor 16z therefore produces the magnetization detection signal proportional to an external magnetic field alone. In the absence of the external magnetic field, the magnetization detection signal and correction current Iz assume a zero level. When the external magnetic field is applied, the magnetization detection signal proportional to the external magnetic field alone is produced. The correction current Iz flows to induce the correction magnetic fields Be. Consequently, the external magnetic field sensed by the magnetic sensor 16z is canceled. Eventually, the static magnetic field BOm will remain unaffected by the external magnetic field.

Now, since the correction current Iz is kept fed, the external magnetic field sensed by the magnetic sensor 16z is not completely canceled. However, the external magnetic field sensed by the magnetic sensor 16z is so small that the adverse effect on the static magnetic field BOm can be ignored.

Incidentally, FIG. 6 shows the mere examples of the directions of magnetic fields and of currents. The actual directions of magnetic fields and of currents may not always agree with the examples.

According to the second embodiment, the MRI system 102 has the advantages described below.

(1) The small-size coils 16t and 16b generate a compensation magnetic field in order to cancel the component of the static magnetic field B0m to be applied to the magnetic sensor 16z. Therefore, the magnetic sensor 16z whose dynamic range permits high-precision detection of an external magnetic field can be placed near the magnet units 31. Consequently, an external magnetic field that adversely affects the static magnetic field B0m can be measured highly precisely.

(2) A compensation magnetic field signal is corrected based on temperature. Therefore, even if the temperature of the magnet units 31 change, the component of the static magnetic field B0m to be applied to the magnetic sensor 16z can be canceled successfully.

(3) The magnetic sensor probe 16 is placed in a space above the magnet units 31. Therefore, the magnetic sensor probe 16 will not interfere with placement of the table 33, control unit 40, and operation unit 50. Moreover, the magnetic sensor probe 16 can be maintained easily.

(4) The correction current Iz proportional to an external magnetic field detected highly precisely is fed to the large-size coils 22t and 22b in order to cancel the external magnetic field. Therefore, the adverse effect of the external magnetic field on the static magnetic field B0m can be nullified highly precisely.

Third Embodiment

Figure 7:
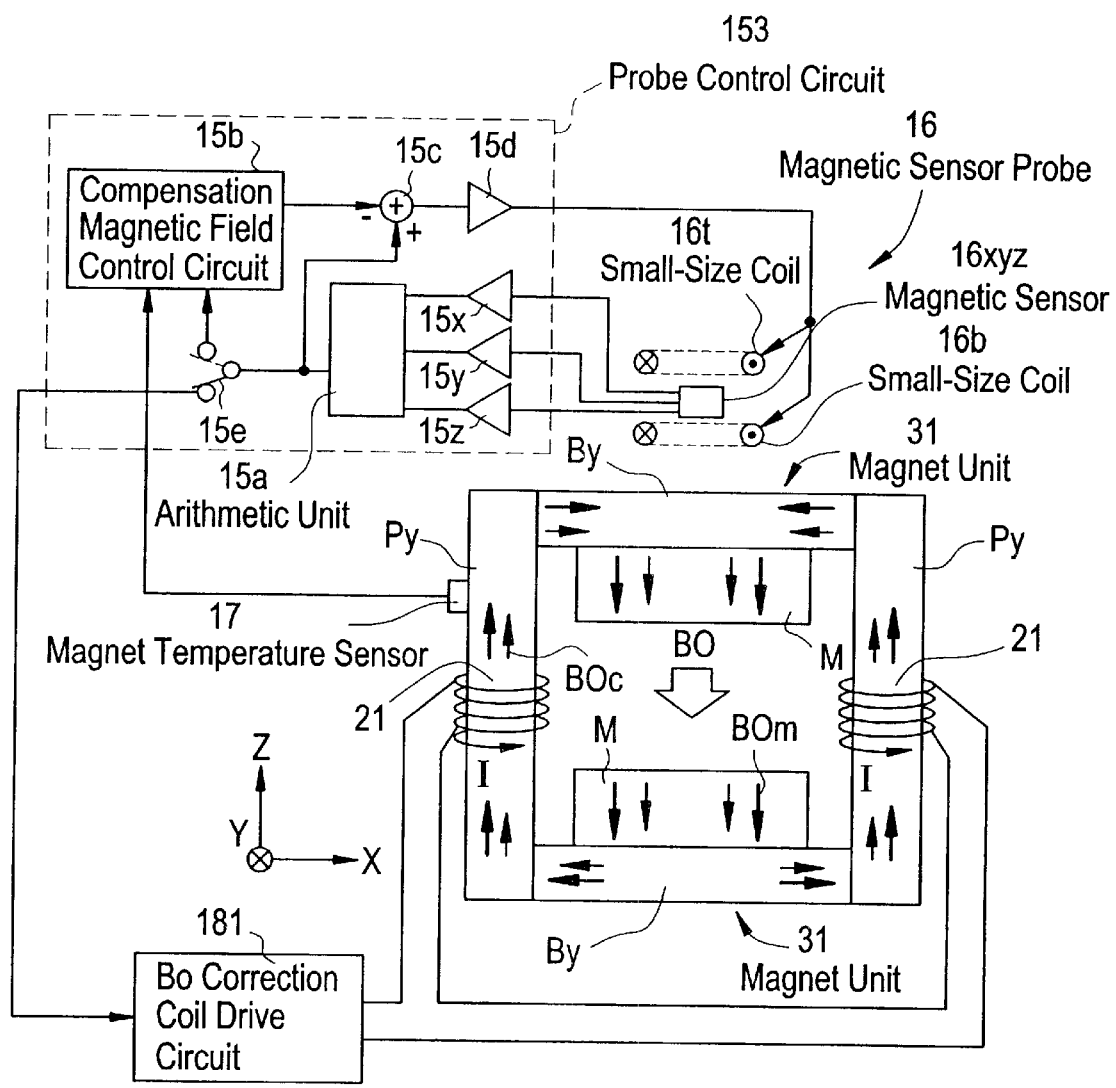
FIG. 7 shows an MRI system in accordance with the third embodiment of the present invention and corresponds to FIG. 3.

FIG. 7 is concerned with a third embodiment of the present invention and corresponds to FIG. 3.

According to the third embodiment, a magnetic sensor 16xyz capable of detecting magnetizations exhibited in the X, Y, and Z directions is substituted for the magnetic sensor 16z capable of detecting a magnetization exhibited in the Z direction and employed in the first embodiment. Moreover, a probe control circuit 153 is substituted for the probe control circuit 151.

The probe control circuit 153 includes amplifiers 15x and 15y in addition to the amplifier 15z that is included in the probe control circuit 151. Moreover, the probe control circuit 153 includes an arithmetic unit 15a that synthesizes (for example, adds up) magnetization detection signals produced by the amplifiers 15x, 15y, and 15z so as to produce one magnetization detection signal.

The components other than the foregoing ones are identical to those of the first embodiment.

According to the third embodiment, the MRI system has the same advantages as the one of the first embodiment. In addition, correction can be performed in consideration of the components of an external magnetic field directed in the Y and X directions.

Fourth Embodiment

Figure 8:
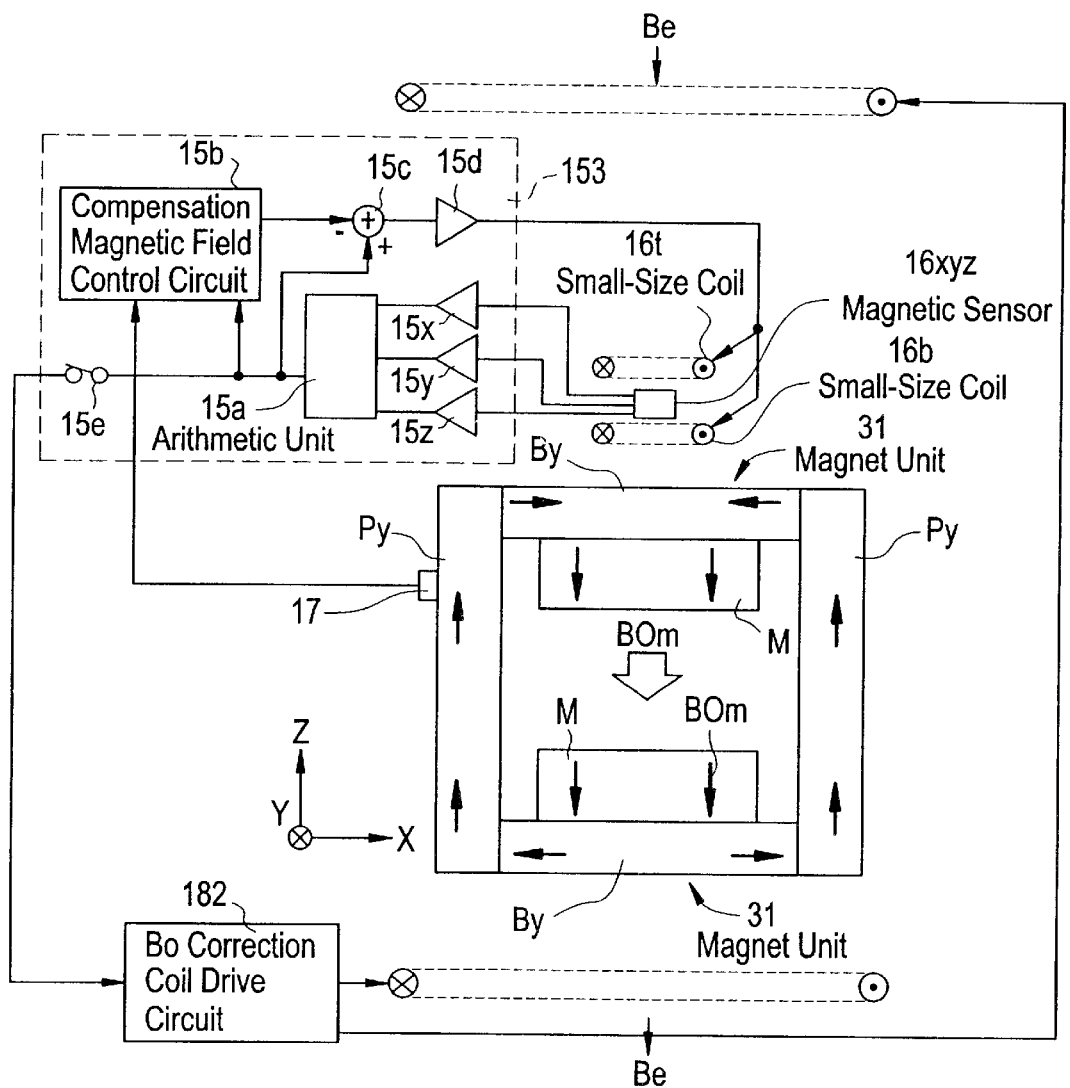
FIG. 8 shows an MRI system in accordance with the fourth embodiment of the present invention and corresponds to FIG. 4.

FIG. 8 is concerned with a fourth embodiment of the present invention and corresponds to FIG. 6.

According to the fourth embodiment, a magnetic sensor 16xyz capable of detecting magnetizations exhibited in the X, Y, and Z directions is substituted for the magnetic sensor 16z capable of detecting a magnetization exhibited in the Z direction and employed in the second embodiment. Moreover, a probe control circuit 153 is substituted for the probe control circuit 151.

According to the fourth embodiment, the MRI system has the same advantages as the second embodiment. In addition, correction can be performed in consideration of the components of an external magnetic field directed in the Y and X directions.

Fifth Embodiment

Figure 9:
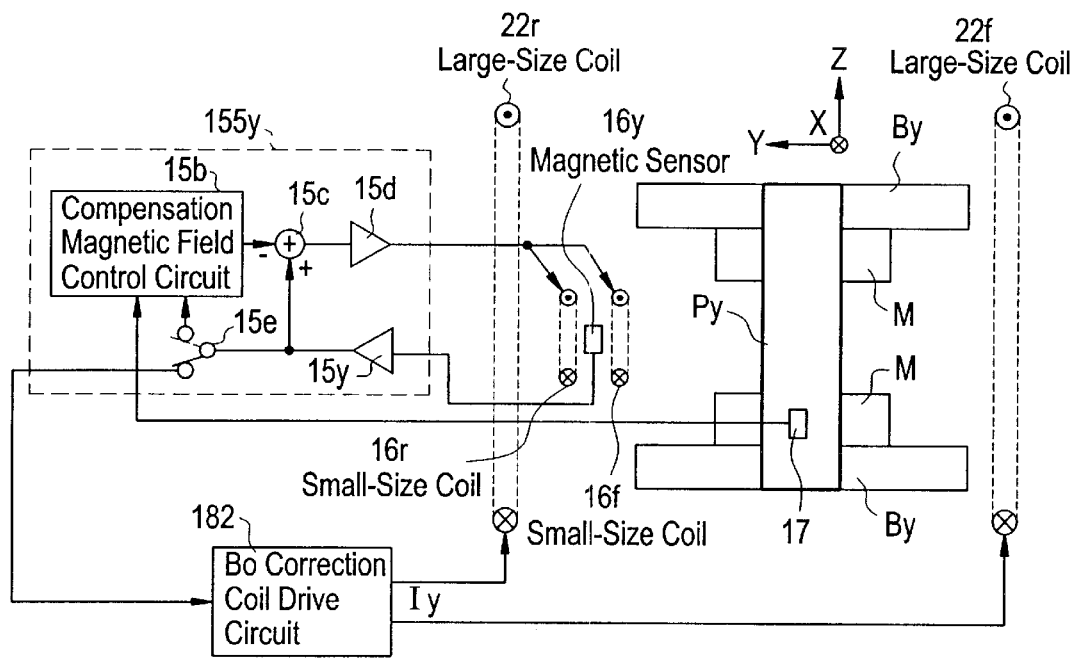
FIG. 9 shows an MRI system in accordance with the fifth embodiment of the present invention and corresponds to FIG. 6.
Figure 10:
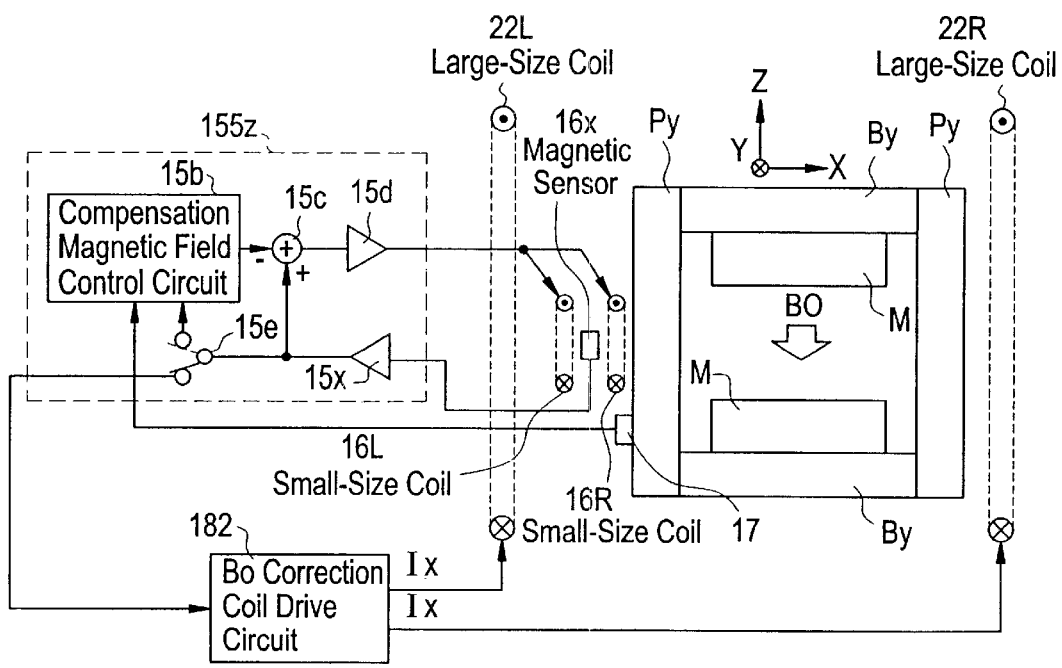
FIG. 10 shows the MRI system in accordance with the fifth embodiment of the present invention and corresponds to FIG. 6.

A fifth embodiment of the present invention has the configurations shown in FIG. 9 and FIG. 10 in addition to the same configuration as the configuration of the second embodiment. Consequently, not only the component of an external magnetic field directed in the Z direction but also the components thereof directed in the Y and X directions can be canceled successfully.

As shown in FIG. 9, a magnetic sensor 16y detects the component of an external magnetic field directed in the Y direction. A correction current Iy is fed to front and rear large-size coils 22f and 22r, whereby the component of the external magnetic field directed in the Y direction is canceled.

As shown in FIG. 10, a magnetic sensor 16x detects the component of an external magnetic field directed in the X direction. A correction current Ix is fed to right and left large coils 22R and 22L, whereby the component of the external magnetic field directed in the X direction is canceled.

According to the fifth embodiment, the MRI system has the same advantages as the one of the second embodiment. In addition, the components of an external magnetic field directed in the Y and X directions can also be canceled.

Many widely different embodiments of the invention may be configured without departing from the spirit and the scope of the present invention. It should be understood that the present invention is not limited to the specific embodiments described in the specification, except as defined in the appended claims.

What is claimed is:

1. An external magnetic field measuring apparatus comprising:
   a magnetization detecting device placed near a magnet assembly included in an MRI system; and
   a magnetic field generating device, located near said magnetization detecting device, for generating a compensation magnetic field so that the compensation magnetic field will cancel a magnetic field generated by said magnet assembly and detected by said magnetization detecting device in the absence of an external magnetic field.

2. An external magnetic field measuring apparatus of claim 1, wherein assuming that the direction of a static magnetic field generated by said magnet assembly is regarded as a Z direction, said magnetization detecting device includes a Z-direction magnetic sensor that detects a magnetization exhibited in the Z direction.

3. An external magnetic field measuring apparatus of claim 2, wherein said magnetic field generating device includes at least a pair of small-size coils that is arranged to sandwich said Z-direction magnetic sensor in the Z direction, and a coil drive circuit that feeds a current to said small-size coils.

4. An external magnetic field measuring apparatus of claim 1, wherein assuming that the direction of a static magnetic field generated by said magnet assembly is regarded as a Z direction and that two mutually orthogonal directions orthogonal to the Z direction are regarded as Y and X directions respectively, said magnetization detecting device includes a Z-direction magnetic sensor, a Y-direction magnetic sensor, and an X-direction magnetic sensor that detect magnetizations exhibited due to said magnet assembly in the Z, Y, and X directions respectively.

5. An external magnetic field measuring apparatus of claim 4, wherein said magnetic field generating device includes a pair of small-size coils that is arranged to sandwich said Z-direction magnetic sensor in the Z direction, a pair of small-size coils that is arranged to sandwich said Y-direction magnetic sensor in the Y direction, a pair of small-size coils that is arranged to sandwich said X-direction magnetic sensor in the X direction, and a coil drive circuit that feeds a current to said small-size coils.

6. An external magnetic field measuring apparatus of claim 4, wherein said magnetic field generating device includes at least a pair of small-size coils that is arranged to sandwich said Z-direction magnetic sensor in the Z direction, and a coil drive circuit that feeds a current to said small-size coils.

7. An external magnetic field measuring apparatus of claim 1, further comprising a temperature correcting device that corrects the compensation magnetic field according to temperature.

8. An external magnetic field measuring apparatus of claim 1, wherein said magnetization detecting device is placed above said magnet assembly.

9. An MRI system comprising:
   a magnet assembly including a yoke;
   a magnetic field correction coil, added to said yoke, for generating a correction magnetic field; and
   a magnetic field correction coil power supply for feeding a correction current, which is proportional to an external magnetic field measured by the external magnetic field measuring apparatus to said magnetic field correction coil so that a correction magnetic field will be generated in order to correct a static magnetic field, wherein said external magnetic field apparatus comprises:
      a magnetization detecting device placed near the magnet assembly included in the MRI system; and
      a magnetic field generating device, located near said magnetization detecting device, for generating a compensation magnetic field so that the compensation magnetic field will cancel a magnetic field generated by said magnet assembly and detected by said magnetization detecting device in the absence of an external magnetic field.

10. An MRI system comprising:
    a pair of large-size coils that, assuming that the direction of a static magnetic field generated by a magnet assembly included in said MRI system is regarded as a Z direction, is arranged to sandwich said magnet assembly in the Z direction; and
    a correction current feeding power supply for feeding a correction current, which is proportional to an external magnetic field measured by the external magnetic field measuring apparatus to said large-sized coils so that a correction magnetic field will be generated in order to correct a static magnetic field, wherein said external magnetic field apparatus comprises:
       a magnetization detecting device placed near a magnet assembly included in an MRI system; and
       a magnetic field generating device, located near said magnetization detecting device, for generating a compensation magnetic field so that the compensation magnetic field will cancel a magnetic field generated by said magnet assembly and detected by said magnetization detecting device in the absence of an external magnetic field.

11. An MRI system comprising:
    a pair of large-sized coils that, assuming that the direction of a static magnetic field generated by a magnet assembly included in an MRI system is regarded as a Z direction and that two mutually orthogonal directions orthogonal to the Z direction are regarded as Y and X directions respectively, is arranged to sandwich said magnet assembly in the Z direction;
    a pair of large-size coils arranged to sandwich said magnet assembly in the Y direction;
    a pair of large-size coils arranged to sandwich said magnet assembly in the X direction; and
    a correction current power supply for feeding a correction current, which is proportional to an external magnetic field measured by the external magnetic field measuring apparatus to said large-size coils so that a correction magnetic field will be generated in order to correct a static magnetic field, wherein said external magnetic field apparatus comprises:
       a magnetization detecting device placed near a magnet assembly included in an MRI system; and
       a magnetic field generating device, located near said magnetization detecting device, for generating a compensation magnetic field so that the compensation magnetic field will cancel a magnetic field generated by said magnet assembly and detected by said magnetization detecting device in the absence of an external magnetic field.

* * * * *